United States Patent
Shima

(10) Patent No.: US 10,516,811 B2
(45) Date of Patent: Dec. 24, 2019

(54) IMAGE READING DEVICE AND SEMICONDUCTOR DEVICE CONFIGURED TO IMAGE OR READ FLUORESCENT COLORS

(71) Applicant: SEIKO EPSON CORPORATION, Tokyo (JP)

(72) Inventor: Shunichi Shima, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/918,622

(22) Filed: Mar. 12, 2018

(65) Prior Publication Data
US 2018/0278809 A1    Sep. 27, 2018

(30) Foreign Application Priority Data

Mar. 22, 2017   (JP) ................. 2017-056345

(51) Int. Cl.
| | |
|---|---|
| *H04N 1/60* | (2006.01) |
| *H04N 1/62* | (2006.01) |
| *H01L 27/146* | (2006.01) |
| *H04N 1/48* | (2006.01) |
| *H04N 1/031* | (2006.01) |

(52) U.S. Cl.
CPC ......... *H04N 1/626* (2013.01); *H01L 27/1461* (2013.01); *H04N 1/0315* (2013.01); *H04N 1/48* (2013.01); *H04N 1/6086* (2013.01)

(58) Field of Classification Search
CPC ...... H04N 1/626; H04N 1/0315; H04N 1/401; H01L 27/1461

USPC ................. 358/509, 512, 514, 518
See application file for complete search history.

(56) References Cited

U.S. PATENT DOCUMENTS

| | | | | |
|---|---|---|---|---|
| 5,032,718 A | * | 7/1991 | Murakami | G02B 6/42 250/208.1 |
| 5,612,794 A | * | 3/1997 | Brandestini | H04N 1/02815 358/505 |
| 2008/0240747 A1 | * | 10/2008 | Ikami | G01N 21/6456 399/32 |
| 2009/0092317 A1 | * | 4/2009 | Nagarajan | G06K 9/2063 382/173 |
| 2014/0132969 A1 | | 5/2014 | Tanaka | |

FOREIGN PATENT DOCUMENTS

JP        5697647 B2     4/2015

* cited by examiner

*Primary Examiner* — Jamares Q Washington
(74) *Attorney, Agent, or Firm* — Oliff PLC

(57) ABSTRACT

An image reading device that reads an image including a fluorescent color, including: a first light source having a maximum light emission intensity at a first wavelength; a second light source having a maximum light emission intensity at a second wavelength that is longer than the first wavelength; and an image reading chip configured to read the image. The image reading chip includes a pixel including a photodetector that performs photoelectric conversion on light received from the image, and the spectral sensitivity of the photodetector when photoelectric conversion is performed takes a maximum value at light having a wavelength in a region from 400 nm to 500 nm inclusive.

11 Claims, 8 Drawing Sheets

IMAGE READING DEVICE AND SEMICONDUCTOR DEVICE CONFIGURED TO IMAGE OR READ FLUORESCENT COLORS

BACKGROUND

1. Technical Field

The present invention relates to image reading devices and semiconductor devices.

2. Related Art

Image reading devices (such as scanners) that use line sensors, and copy machines and multifunctional printers that have a print function in addition to a scan function have been developed. A line sensor used in image reading devices is configured to include photodiodes provided on a semiconductor substrate.

Also, there are cases where a medium to be read by the image reading device (such as a scanner) is colored with a fluorescent color by a highlighter or the like. The fluorescent color is generated by a fluorescent material itself emitting light having a wavelength different from the incident light, in addition to reflecting the incident light. Therefore, it is possible that an original color will not be properly read in a region, of a medium, that is colored a fluorescent color.

A technique for improving the reproducibility of a fluorescent color by performing dedicated image processing when an image (medium) colored with a fluorescent color is read is disclosed in Japanese Patent No. 5697647.

However, in the image forming device described in Japanese Patent No. 5697647, dedicated processing for reading an image with a fluorescent color is required, and therefore control thereof becomes complicated. Furthermore, there is a problem in that a user needs to perform control setting and the like, and operation becomes complicated.

SUMMARY

An advantage of some aspects of the invention is to provide an image reading device in which the reproducibility of an image including a fluorescent color is improved without requiring a complicated operation being performed by a user and complicated control of the image reading device. Also, an advantage of some aspects of the invention is to provide a semiconductor device in which the reproducibility of an image including a fluorescent color is improved.

These and other advantages can be realized as the following modes or application examples.

Application Example 1

An image reading device according to the present application example reads an image including a fluorescent color. The image reading device includes: a first light source having a maximum light emission intensity at a first wavelength; a second light source having a maximum light emission intensity at a second wavelength that is longer than the first wavelength; and an image reading chip configured to read the image. The image reading chip includes a pixel including a photodetector that performs photoelectric conversion on light received from the image, and the spectral sensitivity of the photodetector when photoelectric conversion is performed takes a maximum value at light having a wavelength in a region from 400 nm to 500 nm inclusive.

In the image reading device according to the present application example, the spectral sensitivity of the photodetector that performs photoelectric conversion on light received from an image takes a maximum value at light having a wavelength in a region from 400 nm to 500 nm inclusive, in the image reading chip. That is, the spectral sensitivity of the photodetector decreases on a long wavelength side exceeding 500 nm of wavelength. Accordingly, in the photodetector, the influence of fluorescent light that should not be detected on the reflected light from an image that should be detected can be reduced. As a result, the reproducibility of an image including a fluorescent color can be improved without requiring a complicated operation or complicated control.

Also, in the image reading device according to the present application example, the spectral sensitivity of the photodetector takes a maximum value at light having a wavelength in a range from 400 nm to 500 nm inclusive, in the image reading chip. That is, the spectral sensitivity of the photodetector takes a maximum value at a wavelength in a range including the blue wavelength region. As a result of performing setting such that the spectral sensitivity of the photodetector takes a maximum value at a wavelength in a wavelength region of blue, which has the shortest wavelength among the three primary colors (red, green, and blue), the reproducibility of an image including various fluorescent colors can be improved.

Application Example 2

In the image reading device according to the above-described application example, the first wavelength is 400 nm or more and 500 nm or less, and the spectral sensitivity of the photodetector when photoelectric conversion is performed may take a maximum value at a wavelength on a short wavelength side relative to the first wavelength.

In the image reading device according to the present application example, the spectral sensitivity of the photodetector takes a maximum value at a wavelength on the short wavelength side relative to the first wavelength of light that is output from the first light source on the short wavelength side, in the image reading chip. Accordingly, in the photodetector, the influence of fluorescent light on the light reflected from an image when light is emitted from the first light source that outputs light on the short wavelength side can be reduced. That is, in the photodetector, the influence of fluorescent light that should not be detected on the reflected light from an image that should be detected can be reduced when either of the first light source and the second light source emits light. As a result, the reproducibility of an image including a fluorescent color can be improved without requiring a complicated operation or complicated control.

Application Example 3

In the image reading device according to the above-described application example, the photodetector may be formed in an n-type semiconductor substrate.

In the image reading device according to the present application example, the photodetector is formed in the n-type semiconductor substrate, in the image reading chip. Accordingly, the charges generated by photoelectric conversion in a deep portion of the photodetector are attracted to a positive potential, and are not output as a signal from the photodetector. That is, in the photodetector, the spectral sensitivity on the long wavelength side can be decreased. Accordingly, in the photodetector, the influence of fluorescent light that should not be detected on the reflected light from an image that should be detected can be further reduced. As a result, the reproducibility of an image including a fluorescent color can be improved without requiring a complicated operation or complicated control.

Application Example 4

In the image reading device according to the above-described application example, a lighting time of the first light source may be shorter than a lighting time of the second light source.

In the image reading device according to the present application example, the lighting time of the first light source that emits light on the short wavelength side is shorter than the lighting time of the second light source that emits light on the long wavelength side. Accordingly, the light receiving amount detected by the photodetector can be equivalent in a region on the short wavelength side in which the spectral sensitivity of the photodetector is high and in a region on the long wavelength side in which the spectral sensitivity of the photodetector is low, and as a result, the resolution of a signal detected by the photodetector can be increased. Accordingly, the ability to read an image can be further improved.

Application Example 5

In the image reading device according to the above-described application example, a light emission intensity of the first light source may be weaker than a light emission intensity of the second light source.

In the image reading device according to the present application example, the light emission intensity of the first light source that emits light on the short wavelength side is weaker than a light emission intensity of the second light source that emits light on the long wavelength side. Accordingly, the light receiving amount detected by the photodetector can be equivalent in a region on the short wavelength side in which the spectral sensitivity of the photodetector is high and in a region on the long wavelength side in which the spectral sensitivity of the photodetector is low, and as a result, the resolution of a signal detected by the photodetector can be increased. Accordingly, the ability to read a medium can be further improved.

Application Example 6

In the image reading device according to the above-described application example, the spectral sensitivity of the photodetector when photoelectric conversion is performed on light having a wavelength of 700 nm may be 0.7 times the spectral sensitivity when photoelectric conversion is performed on light having the first wavelength, or less.

Application Example 7

In the image reading device according to the above-described application example, the spectral sensitivity of the photodetector when photoelectric conversion is performed on light having a wavelength of 700 nm may be 0.5 times the spectral sensitivity when photoelectric conversion is performed on light having the first wavelength, or less.

Application Example 8

In the image reading device according to the above-described application example, the spectral sensitivity of the photodetector when photoelectric conversion is performed on light having a wavelength of 600 nm may be 0.85 times the spectral sensitivity when photoelectric conversion is performed on light having the first wavelength, or less.

In the image reading device according to these application examples, in the photodetector, the influence of fluorescent light that should not be detected on the reflected light from an image that should be detected can be reduced, in the image reading chip. As a result, the reproducibility of an image including a fluorescent color can be further improved without requiring a complicated operation or complicated control.

For example, as a result of setting the spectral sensitivity of the photodetector at a wavelength of 700 nm to be 0.7 times the spectral sensitivity of the photodetector at the first wavelength, or less, the influence of fluorescent light that should not be detected on the reflected light from an image that should be detected can be reduced, in the photodetector. As a result, the reproducibility of an image including a fluorescent color can be improved without requiring a complicated operation or complicated control.

Furthermore, as a result of setting the spectral sensitivity of the photodetector at a wavelength of 700 nm to be 0.5 times the spectral sensitivity of the photodetector at the first wavelength, or less, the influence of fluorescent light that should not be detected on the reflected light from an image that should be detected can be further reduced, in the photodetector. As a result, the reproducibility of an image including a fluorescent color can be further improved without requiring a complicated operation or complicated control.

Also, as a result of setting the spectral sensitivity of the photodetector at a wavelength of 600 nm to be 0.85 times the spectral sensitivity of the photodetector at the first wavelength, or less, the detection sensitivity of the photodetector can be gradually decreased from the wavelength at which the detection sensitivity of the photodetector takes the maximum value to a wavelength of 700 nm. Accordingly, the influence of fluorescent light that should not be detected on the reflected light from an image that should be detected can be further reduced in a wide wavelength region. Therefore, the reproducibility of an image including a fluorescent color can be further improved.

Application Example 9

In the image reading device according to the above-described application example, the fluorescent color is a color of a region colored by a highlighter, and the image may include the region colored by a highlighter.

The spectral sensitivity of the photodetector takes a maximum value at light having a wavelength in a range from 400 nm to 500 nm inclusive. That is, the spectral sensitivity of the photodetector takes a maximum value at a wavelength in a range including the blue wavelength region. As a result of performing setting such that the spectral sensitivity of the photodetector takes a maximum value at a wavelength in a wavelength region of blue, which has the shortest wavelength among the three primary colors (red, green, and blue), the reproducibility of an image colored by highlighters of various fluorescent colors can be improved.

Application Example 10

A semiconductor device according to the present application example includes a pixel including a photodetector that performs photoelectric conversion on light received from an image. The spectral sensitivity of the photodetector when photoelectric conversion is performed takes a maximum value at light having a wavelength in a region from 400 nm to 500 nm inclusive.

In the semiconductor device according to the present application example, the spectral sensitivity of the photodetector takes a maximum value at light having a wavelength in a region from 400 nm to 500 nm inclusive. That is, in the photodetector, the spectral sensitivity decreases on the long wavelength side exceeding 500 nm of wavelength. Accordingly, in the photodetector, the influence of fluorescent light that should not be detected on the reflected light from an image that should be detected can be reduced. As a result, the reproducibility of an image including a fluorescent color can be improved.

In the semiconductor device according to the present application example, the spectral sensitivity of the photodetector takes a maximum value at light having a wavelength in a region from 400 nm to 500 nm inclusive. That is, the spectral sensitivity of the photodetector takes a maximum value at a wavelength in a range including the blue wavelength region. As a result of setting such that the spectral sensitivity of the photodetector takes a maximum value at a wavelength in a wavelength region of blue, which has the shortest wavelength among the three primary colors, the reproducibility of an image including various fluorescent colors can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The drawings used are provided to facilitate the understanding of the description. Note that the embodiments given below are not intended to unduly limit the scope of the invention recited in the appended claims. In addition, not all of the constituent elements described below are essential to the invention.

A description will be given below of a multifunction peripheral (multifunction peripheral apparatus) 1, to which an image reading device according to the invention is applied, with reference to the accompanying drawings.

1. Outline of Multifunction Peripheral

Figure 1:
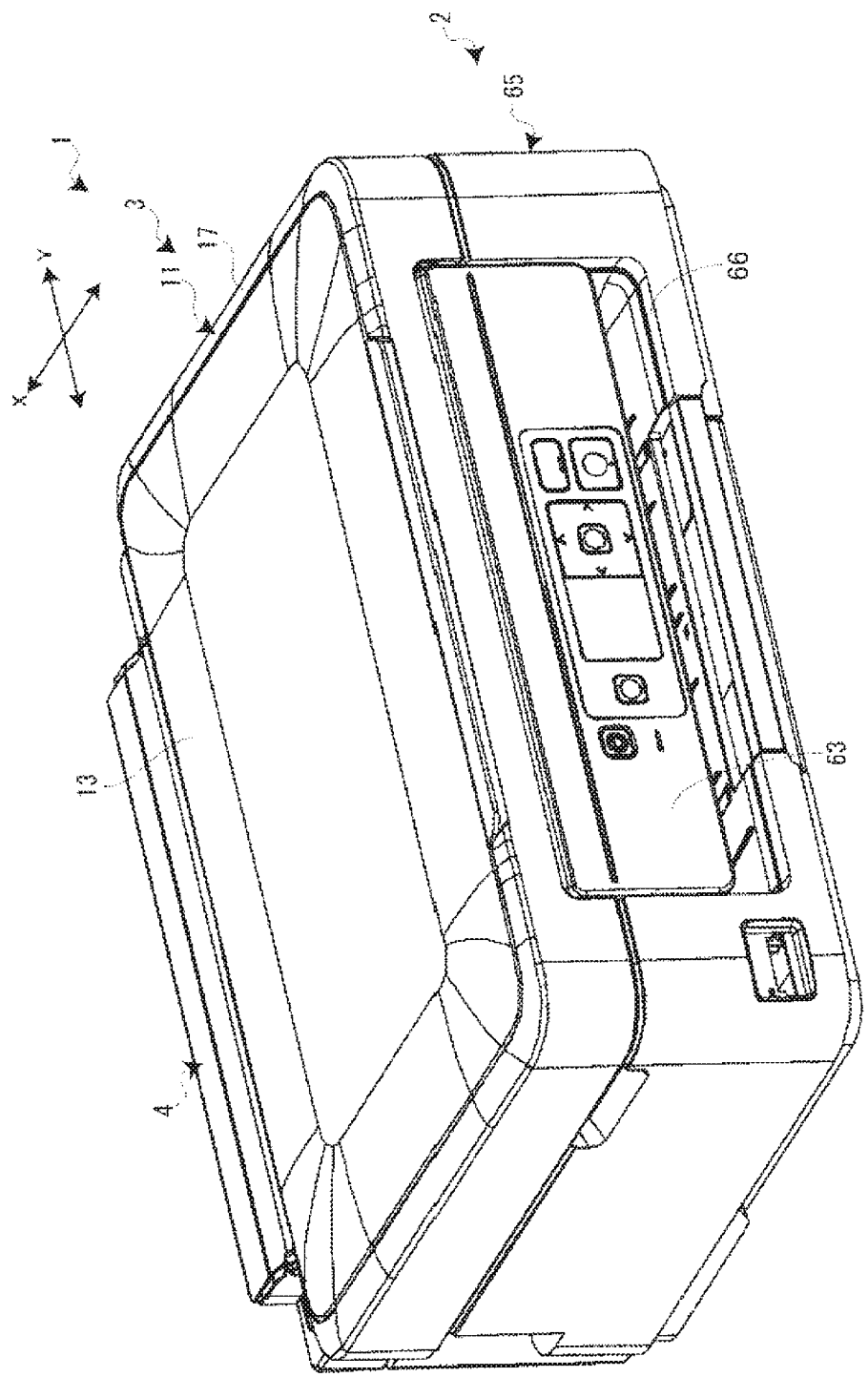
FIG. 1 is an external perspective view of a multifunction peripheral according to a present embodiment.

FIG. 1 is an external perspective view illustrating the multifunction peripheral 1. As shown in FIG. 1, the multifunction peripheral 1 integrally includes a printer unit (image recording device) 2 that is a device main body, and a scanner unit (image reading device) 3 that is an upper unit provided on top of the printer unit 2. Note that, in the following description, a front rear direction in FIG. 1 is defined as a main scanning direction X, and a right left direction is defined as a sub scanning direction Y. Also, the main scanning direction X and the sub scanning direction Y are described in the drawings as X and Y that are orthogonal to each other.

As shown in FIG. 1, the printer unit 2 includes: a conveyance portion (not shown) that conveys a sheet of recording medium (print paper or cut sheets) along a feed path; a printing portion (not shown) that is provided above the feed path, and performs inkjet print processing on the recording medium; a panel operation portion 63 provided on a front face; a device frame (not shown) incorporating the conveyance portion, the printing portion, and the operation portion 63; and a device housing 65 that covers the above-described constituent elements. The device housing 65 is provided with a discharge port 66 through which the printed recording medium is discharged. Although not shown in the diagram, a USB port and a power supply port are provided in a lower portion of a rear face. That is, the multifunction peripheral 1 is configured to be connectable to a computer and the like via the USB port.

The scanner unit 3 is pivotably supported by the printer unit 2 via a hinge 4 provided at a rear end, and covers a top portion of the printer unit 2 so as to be capable of opening and closing. That is, by raising the scanner unit 3 in the pivotal direction, an upper surface opening of the printer unit 2 is exposed so as to expose the inside of the printer unit 2 via the upper surface opening. On the other hand, by lowering the scanner unit 3 in the pivotal direction to place it on the printer unit 2, the upper surface opening is closed by the scanner unit 3. The configuration in which the scanner unit 3 can be opened in the manner as described above allows ink cartridge exchange, the clearance of paper jams, and the like to be performed.

Figure 2:
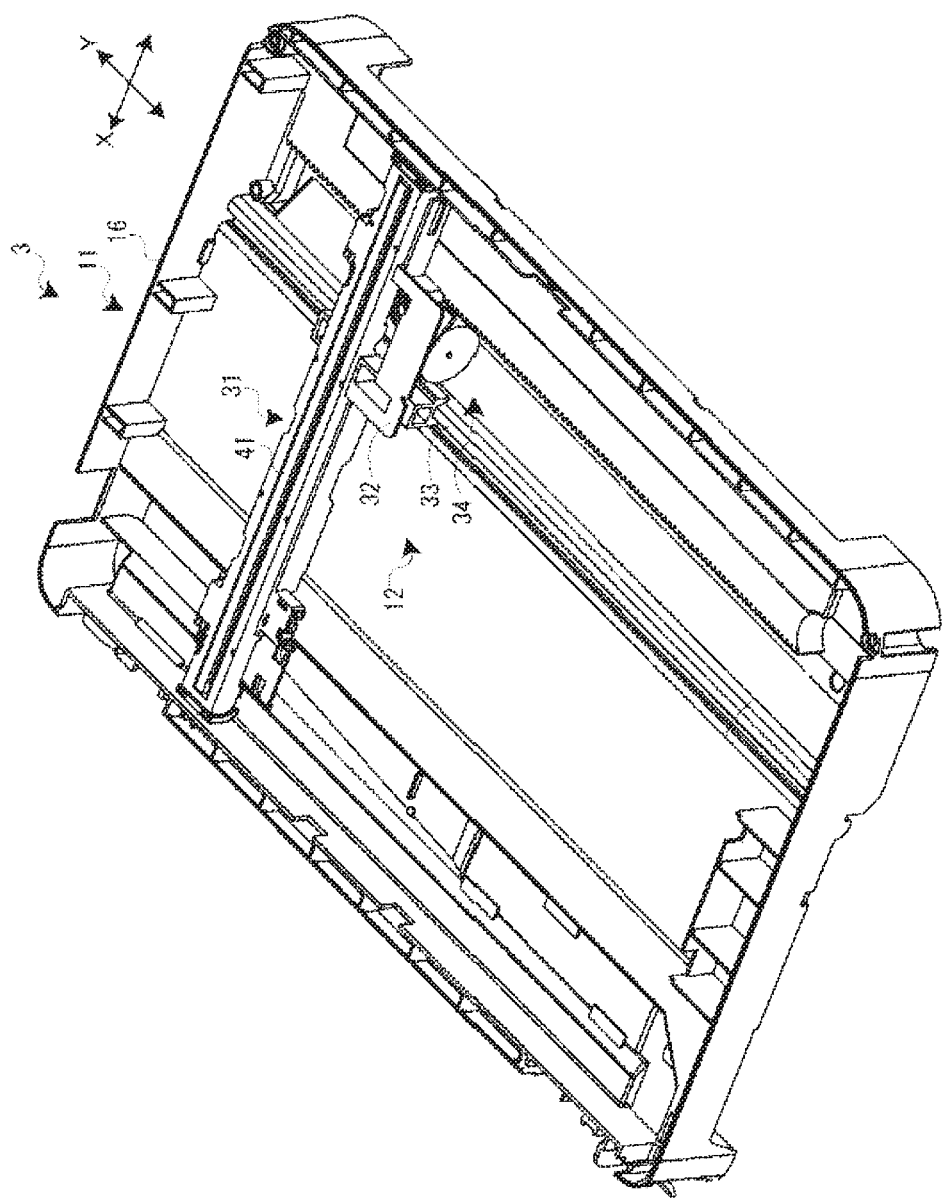
FIG. 2 is a perspective view of an internal structure of a scanner unit.

FIG. 2 is a perspective view of an internal structure of the scanner unit 3. As shown in FIGS. 1 and 2, the scanner unit 3 includes an upper frame 11 that is a casing, an image reading portion 12 housed in the upper frame 11, and an upper cover 13 that is pivotably supported on top of the upper frame 11. The upper frame 11 includes a box-shaped lower case 16 that houses the image reading portion 12 and an upper case 17 that covers the top side of the lower case 16.

A document placing plate made of glass is provided over the upper case 17, and a medium (example of "image") is placed on the document placing plate with the side to be read facing downward. On the other hand, the lower case 16 is formed to have a shallow box shape with its upper side being open.

As shown in FIG. 2, the image reading portion 12 includes a line sensor type sensor unit 31, a sensor carriage 32 incorporating the sensor unit 31, a guide shaft 33 that extends in the sub scanning direction Y and slidably supports the sensor carriage 32, and a self-propelled sensor moving mechanism 34 that moves the sensor carriage 32 along the guide shaft 33. The sensor unit 31 includes an image sensor module 41 that is constituted by a CMOS (complementary metal-oxide-semiconductor) line sensor extending in the main scanning direction X, and is moved back and forth along the guide shaft 33 in the sub scanning direction Y by the motor-driven sensor moving mechanism 34. Accordingly, the image on the medium placed on the document placing plate is read. The sensor unit 31 may be constituted by a CCD (charge coupled device) line sensor.

Figure 3:
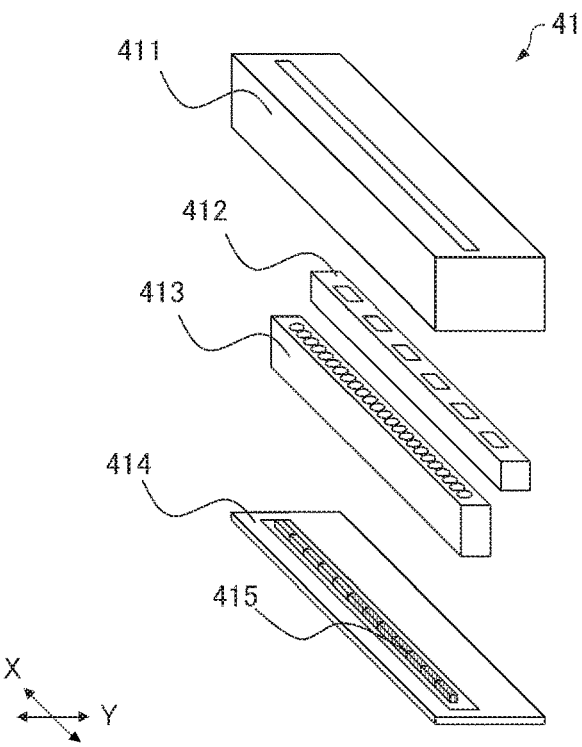
FIG. 3 is an exploded perspective view schematically illustrating a configuration of an image sensor module.

FIG. 3 is an exploded perspective view schematically illustrating a configuration of the image sensor module 41.

In the example shown in FIG. 3, the image sensor module 41 includes a case 411, a light source 412, an optical portion 413, a module substrate 414, and an image reading chip 415 (semiconductor device) for reading a medium. The light source 412, the optical portion 413, and the image reading chip 415 are housed between the case 411 and the module substrate 414. The case 411 is provided with a slit. The light source 412 includes red, green, and blue light emitting diodes (LEDs), for example. The red, green, and blue light emitting diodes (red LED, green LED, and blue LED) are caused to exclusively emit light while being switched therebetween at high speed. The light emitted by the light source 412 is incident on a reading target medium via the slit, and the light reflected by the medium is input to the optical portion 413 via the slit. The optical portion 413 guides the input light to an image reading chip 415.

Figure 4:
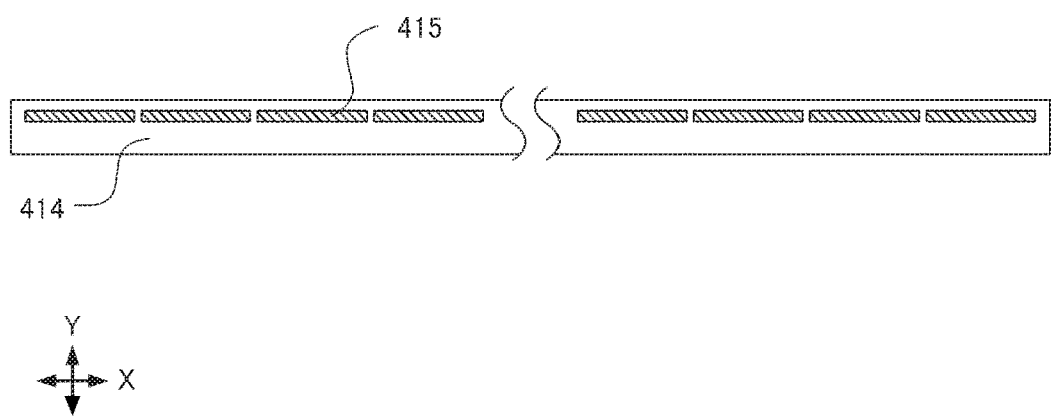
FIG. 4 is a plan view schematically illustrating an arrangement of image reading chips.

FIG. 4 is a plan view schematically showing an arrangement of the image reading chip 415. As shown in FIG. 4, a plurality of image reading chips 415 are arranged side by side on the module substrate 414 in a unidimensional direction (the main scanning direction X in FIG. 4). Each image reading chip 415 includes a large number of photodetectors that are arranged in a line. The more densely the photodetectors are provided in each image reading chip 415, the higher medium reading resolution of the scanner unit 3 can be achieved. Also, by providing a greater number of image reading chips 415, it is possible to realize a scanner unit 3 that can read a large medium as well.

2. Functional Configuration of Image Reading Device

Figure 5:
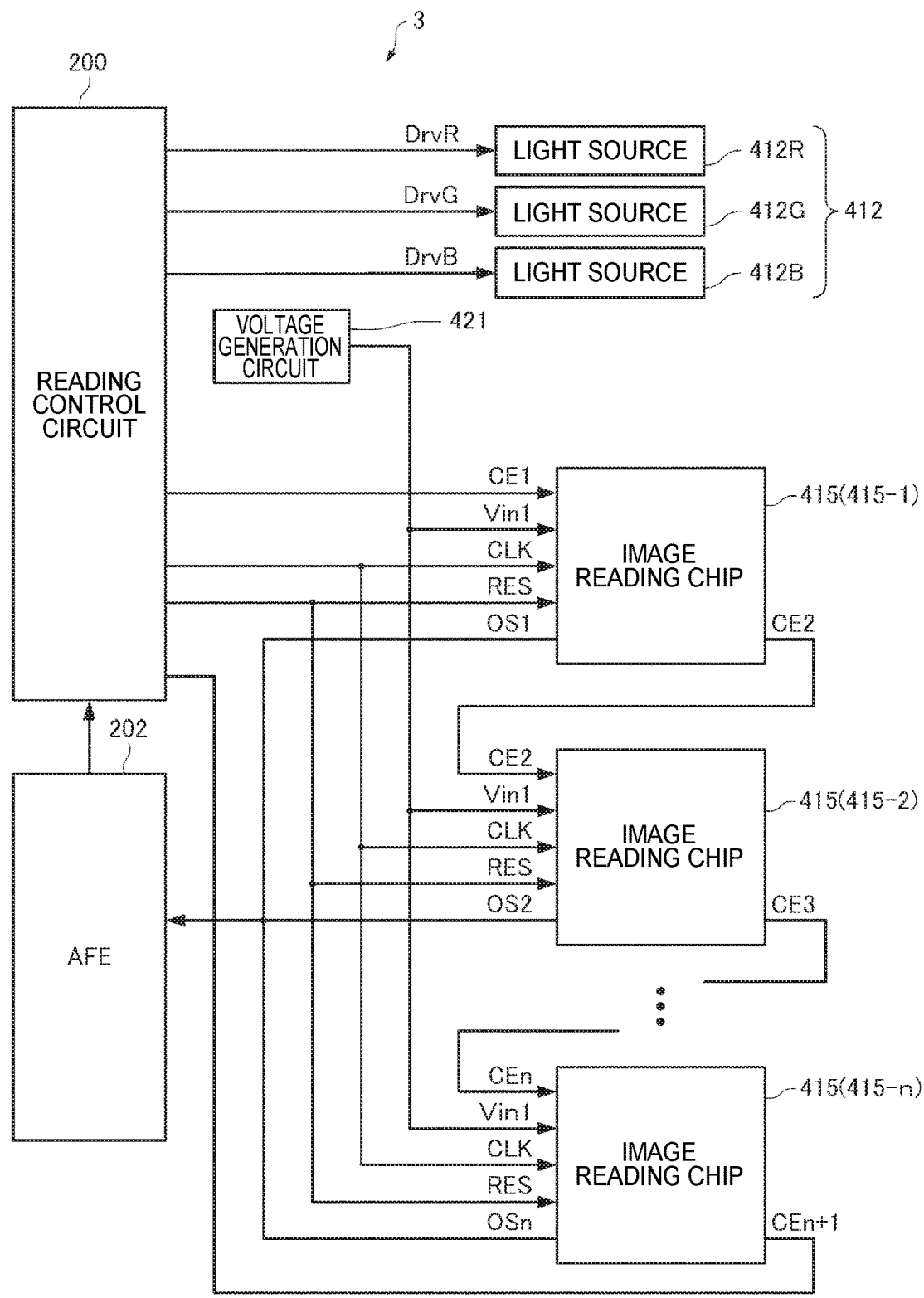
FIG. 5 is a block diagram illustrating a functional configuration of the scanner unit.

FIG. 5 is a functional configuration diagram of the scanner unit 3. In the example shown in FIG. 5, the scanner unit 3 includes a reading control circuit 200, an analog front end (AFE) 202, a light source 412, the plurality of image reading chips 415 (415-1 to 415-n), and a voltage generation circuit 421. As described above, the light source 412 includes a red LED 412R (example of "second light source"), a green LED 412G, and a blue LED 412B (example of "first light source"), and the plurality of image reading chips 415 are arranged side by side on the module substrate 414. Also, the reading control circuit 200, the analog front end 202, and the voltage generation circuit 421 are provided in the module substrate 414 or in an unshown substrate that is different from the module substrate 414. Also, the reading control circuit 200, the analog front end 202, and the voltage generation circuit 421 are each constituted by an integrated circuit (IC).

The reading control circuit 200 causes one of the red LED 412R, the green LED 412G, and the blue LED 412B to emit light in a read period T of a medium. For example, in a read period T, the reading control circuit 200 supplies a drive signal DrvR only in a fixed exposure time ΔtR to cause the red LED 412R to emit light. Also, in a different read period T, the reading control circuit 200 supplies a drive signal DrvG only in a fixed exposure time ΔtG to cause the green LED 412G to emit light. Also, in a different read period T, the reading control circuit 200 supplies a drive signal DrvB only in a fixed exposure time ΔtB to cause the blue LED 412B to emit light.

Also, the reading control circuit 200 supplies a clock signal CLK and a resolution setting signal RES to the plurality of image reading chips 415 in common. The clock signal CLK is an operation clock signal for the image reading chips 415, and the resolution setting signal RES is a signal for setting a resolution in reading a medium by the scanner unit 3. The resolution setting signal RES may be a 2-bit signal, which causes the resolution of 1200 dpi to be set when "00", 600 dpi to be set when "01", and 300 dpi to be set when "01", for example.

N chips of the image reading chips 415 (415-1 to 415-n) are arranged side by side on the module substrate 414. The image reading chips 415 operate in synchronization with the clock signal CLK when respective chip enable signals CEi (i=1 to n) are activated (high level, in the present embodiment). The image reading chips 415 (415-1 to 415-n) each detect light that was emitted by the light source 412 and reflected by a medium to be read using photodetectors 111 (refer to FIG. 7), and convert the detected light to an electric signal. Then, the image reading chips 415 (415-1 to 415-n) respectively generate and output image signals OSi (i=1 to n) including image information based on the resolution set by the resolution setting signal RES.

The voltage generation circuit 421 supplies various types of power for the image reading chips 415 (415-1 to 415-n) to operate.

The analog front end 202 receives the image signals OSi (i=1 to n) that are respectively output by the plurality of image reading chips 415 (415-1 to 415-n), performs amplification processing and A/D conversion processing on the received image signals OSi (i=1 to n), and converts the received image signals to digital signals each including a digital value according to the amount of light received by a photodetector 111. Then, the analog front end 202 sequentially transmits the digital signals to the reading control circuit 200.

The reading control circuit 200 receives the digital signals sequentially transmitted from the analog front end 202, and generates read image information of the image sensor module 41.

3. Configuration and Operation of Image Reading Chip

The configuration and operation of the image reading chip 415 in the present embodiment will be described using FIGS. 6 to 8. Note that because the plurality of image reading chips 415 (415-1 to 415-n) that constitute the image sensor module 41 all have the same configuration, each image reading chip 415 will be described as an image reading chip 415. Also, the chip enable signals CEi (i=1 to n) respectively input to the image reading chips 415-i (i=1 to n) will each be described as a chip enable signal CE_in, and chip enable signals CEi+1 (i=1 to n) that are respectively output from the image reading chips 415-i (i=1 to n) will each be described as a chip enable signal CE_out. Also, image signals OSi (i=1 to n) respectively output from the image reading chips 415-i (i=1 to n) will each be described as an image signal OS. Also, when it is not necessary to make a distinction between the red LED 412R, the green LED 412G, and the blue LED 412B, they are collectively referred to as a light source 412. Note that, at this time, the lighting time of the light source will be referred to as an exposure time Δt, and the signal for controlling the lighting time is referred to as a drive signal Drv.

Figure 6:
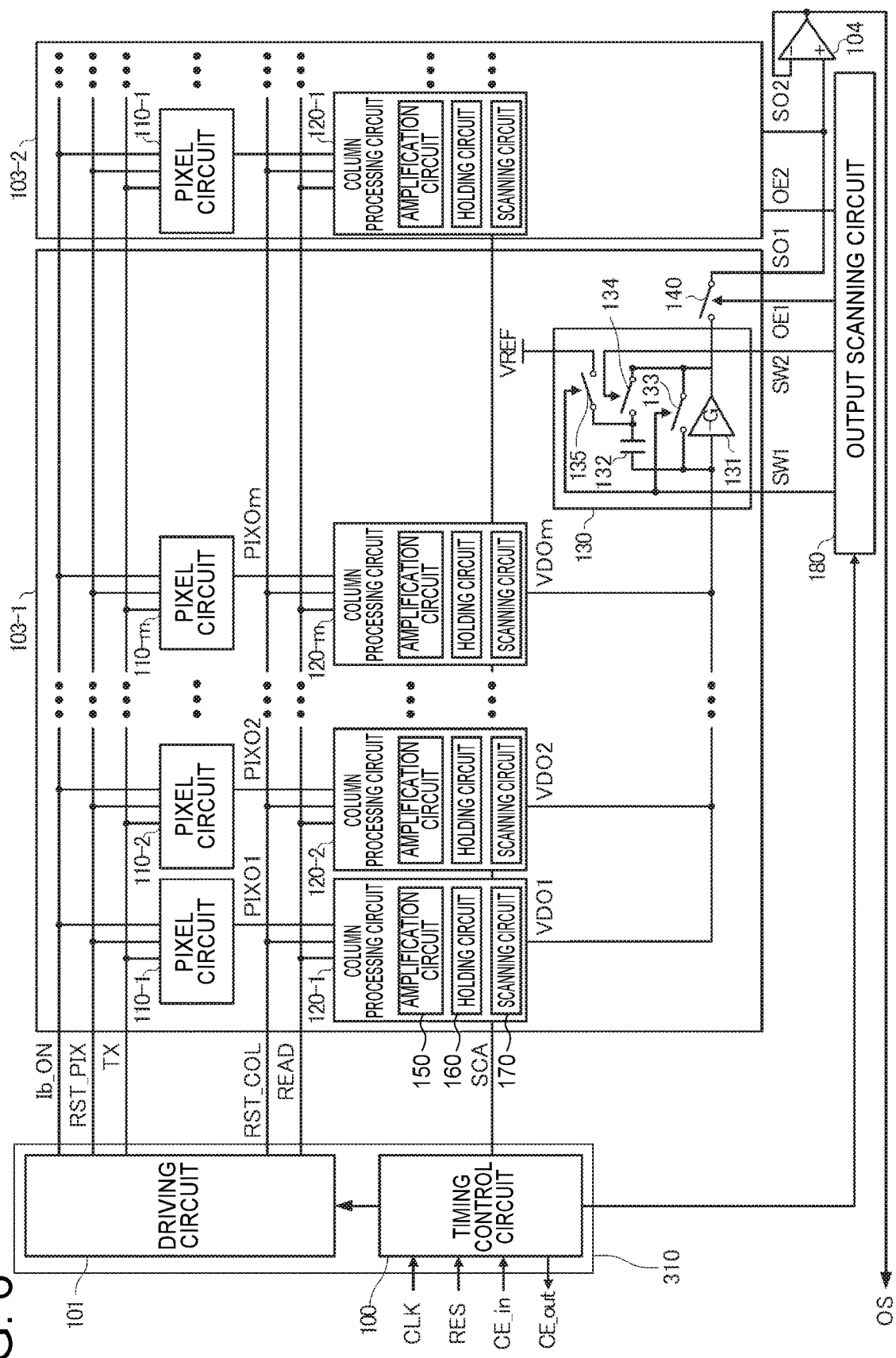
FIG. 6 is a block diagram illustrating a circuit configuration of the image reading chip.

FIG. 6 is a diagram illustrating a circuit configuration of the image reading chip 415. The image reading chip 415 shown in FIG. 6 includes a drive control circuit 310, two signal processing circuits 103-1 and 103-2, an operational amplifier 104, and an output scanning circuit 180.

The drive control circuit 310 includes a timing control circuit 100 and a driving circuit 101.

The timing control circuit 100 includes an unshown counter that counts pulses of the clock signal CLK, and generates a control signal for controlling the operation of the driving circuit 101, a control signal for controlling the operation of the output scanning circuit 180, and a scan signal SCA for controlling the operations of a later-described scanning circuit 170 based on an output value (count value) of the counter.

Also, the timing control circuit 100, upon receiving an active chip enable signal CE_in, activates the operation of the image reading chip 415. Also, the timing control circuit 100, after completing the processing of the image reading chip 415 and outputting an active chip enable signal CE_out to the next image reading chip 415 or the reading control circuit 200 (refer to FIG. 5), deactivates the operation of the image reading chip 415.

The driving circuit 101 generates a bias current ON signal Ib_ON, in synchronization with the clock signal CLK, that is activated (high level, in the present embodiment) during a fixed time period at a predetermined timing based on the control signal from the timing control circuit 100. This bias current ON signal Ib_ON is supplied, in common, to m pixel circuits 110 (110-1 to 110-m) included in each of the two signal processing circuits 103-1 and 103-2.

Also, the driving circuit 101 generates a pixel reset signal RST_PIX and a column reset signal RST_COL, in synchronization with the clock signal CLK, that is activated (high level, in the present embodiment) during a fixed time period at a predetermined timing based on the control signal from the timing control circuit 100. This pixel reset signal RST_PIX is supplied, in common, to the m pixel circuits 110 (110-1 to 110-m) included in each of the two signal processing circuits 103-1 and 103-2. Also, the column reset signal RST_COL is supplied, in common, to m column processing circuits 120 (120-1 to 120-m) included in each of the two signal processing circuits 103-1 and 103-2.

Also, the driving circuit 101 generates a transfer signal TX and a readout signal READ, in synchronization with the clock signal CLK, that is activated (high level, in the present embodiment) during a fixed time period at a predetermined timing based on the control signal from the timing control circuit 100. The transfer signal TX is supplied, in common, to the m pixel circuits 110 (110-1 to 110-m) included in each of the two signal processing circuits 103-1 and 103-2. Also, the readout signal READ is supplied, in common, to the m column processing circuits 120 (120-1 to 120-m) included in each of the two signal processing circuits 103-1 and 103-2.

The two signal processing circuits 103-1 and 103-2 have the same configuration, and each include the m pixel circuits 110 (110-1 to 110-m), the m column processing circuits 120 (120-1 to 120-m), an amplification circuit 130, and a switch 140.

The m pixel circuits 110 (110-1 to 110-m) (example of "pixel") respectively output pixel signals PIXO1 to PIXOm each having a voltage corresponding to the amount of light received from a medium during a period of exposure time Δt, due to light emitted by the light source 412.

The m column processing circuits 120 (120-1 to 120-m) each include an amplification circuit 150, a holding circuit 160, and a scanning circuit 170.

The m column processing circuits 120 (120-1 to 120-m) respectively amplify the pixel signals PIXO1 to PIXOm output from the m pixel circuits 110 (110-1 to 110-m) using the respective amplification circuits 150, and each store the amplified voltage in the holding circuit 160 according to the readout signal READ. Then, the column processing circuits 120 (120-1 to 120-m) sequentially output respective image signals VDO1 to VDOm based on the voltage stored in the respective holding circuits 160 to the amplification circuit 130 based on the scan signal SCA input to the scanning circuit 170.

Here, in the present embodiment, the scanning circuits 170 respectively included in the m column processing circuits 120 (120-1 to 120-m) sequentially operate according to the scan signal SCA input from the timing control circuit 100. Specifically, each scanning circuit 170 includes a shift register, for example. For example, when the scan signal SCA is input to the scanning circuit 170 included in the column processing circuit 120-j (j=1 to m−1), the column processing circuit 120-j (j=1 to m−1) outputs the image signal VDOj (j=1 to m−1) to the amplification circuit 130, and outputs the scan signal SCA to the column processing circuit 120-j+1 (j=1 to m−1). The scan signal SCA is input to the scanning circuit 170 included in the column processing circuit 120-j+1 (j=1 to m−1), and the column processing circuit 120-j+1 (j=1 to m−1) outputs the image signal VDOj+1 (j=1 to m−1) to the amplification circuit 130.

The amplification circuit 130 includes an operational amplifier 131, a capacitor 132, and switches 133 to 135.

The operational amplifier 131 is a grounded source amplifier constituted by a plurality of MOS transistors, for example. The capacitor 132 is a feedback capacitor of the operational amplifier 131. The switch 133 is a feedback switch of the operational amplifier 131. The switch 134 is a feedback signal control switch of the operational amplifier 131. The switch 135 is an external input signal control switch of the operational amplifier 131.

One end of the switch 133 and one end of the capacitor 132 is connected to an input terminal of the operational amplifier 131. The other end of the capacitor 132 is connected to one end of the switch 134 and one end of the switch 135.

The other end of the switch 133 and the other end of the switch 134 are connected to an output terminal of the operational amplifier 131. A reference voltage VREF is applied to the other end of the switch 135. The reference voltage VREF may be generated by a voltage generator that is not shown in FIG. 6, or may be supplied from an external terminal of the image reading chip 415.

A switch control signal SW1 from the output scanning circuit 180 is commonly input to a control terminal of the switch 133 and a control terminal of the switch 135, and the switches 133 and 135 are turned on when the switch control signal SW1 is activated (high level, in the present embodiment). Also, a switch control signal SW2 from the output scanning circuit 180 is input to a control terminal of the switch 134, and the switch 134 is turned on when the switch control signal SW2 is activated (high level, in the present embodiment). The switch control signal SW1 and the switch control signal SW2 are exclusively activated (high level, in the present embodiment).

Output enable signals OE1 and OE2 from the output scanning circuit 180 are respectively input to control terminals of the switches 140 respectively included in the two signal processing circuits 103-1 and 103-2. The switches 140 included in the two signal processing circuits 103-1 and 103-2 are respectively turned on when the respective output enable signals OE1 and OE2 are activated (high level, in the present embodiment).

The output enable signals OE1 and OE2 are signals only one of which is sequentially activated (high level), and the two signal processing circuits 103-1 and 103-2 sequentially output image signals SO1 and SO2 from the amplification circuits 130 via the switches 140, respectively.

Output terminals (other ends of respective switches 140) of the two signal processing circuits 103-1 and 103-2 are commonly connected to a non-inverting input terminal of the operational amplifier 104, and an inverting input terminal is connected to an output terminal thereof. This operational amplifier 104 is configured as a voltage follower, and the output voltage matches the voltage at the non-inverting input terminal. Accordingly, the output of the operational amplifier 104 is a signal that sequentially includes the image signals SO1 and SO2, and is output as an image signal OS from the image reading chip 415.

Also, them pixel circuits 110 (110-1 to 110-$m$) shown in FIG. 6 all have the same configuration. Similarly, the m column processing circuits 120 (120-1 to 120-$m$) all have the same configuration. Therefore, each of the m pixel circuits 110 (110-1 to 110-$m$) will be described in detail as a pixel circuit 110, and each of them column processing circuits 120 (120-1 to 120-$m$) will be described in detail as a column processing circuit 120, using FIG. 7.

Figure 7:
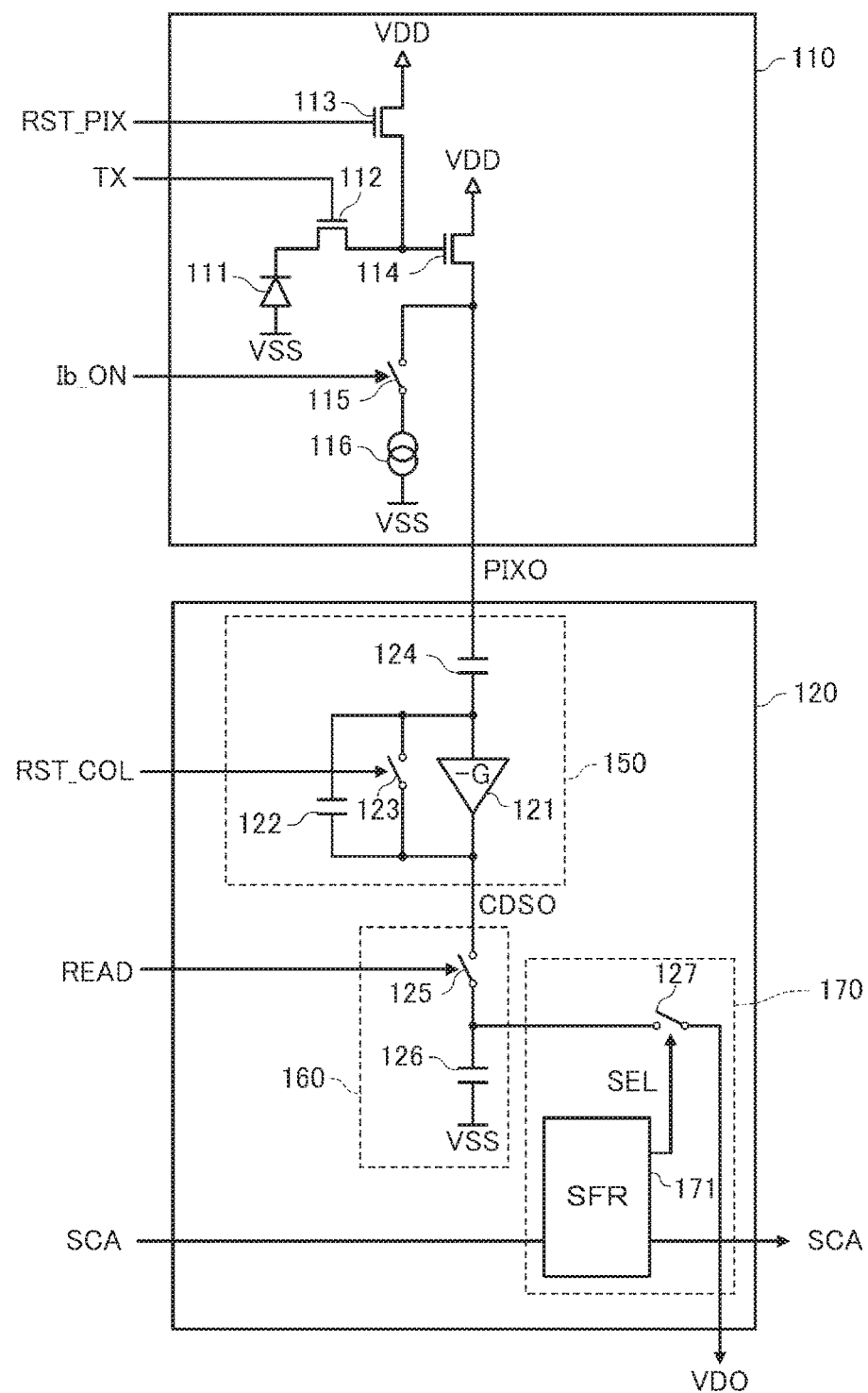
FIG. 7 is a circuit configuration diagram illustrating a configuration of a pixel circuit and a column processing circuit.

FIG. 7 is a diagram illustrating a circuit configuration of the pixel circuit 110 and the column processing circuit 120.

As shown in FIG. 7, the pixel circuit 110 includes the photodetector 111 (example of "photodetector"), a transfer gate 112, NMOS transistors 113 and 114, a switch 115, and a constant current source 116.

The photodetector 111 converts (photoelectric conversion) the received light to an electric signal. In the present embodiment, the photodetector 111 is constituted by a photodiode whose anode is supplied with a ground potential VSS and whose cathode is connected to one end of the transfer gate 112.

The transfer signal TX is input to a control terminal of the transfer gate 112, and the other end of the transfer gate 112 is connected to a gate terminal of the NMOS transistor 114.

The NMOS transistor 113 has a drain terminal supplied with a power supply potential VDD, a gate terminal to which the pixel reset signal RST_PIX is input, and a source terminal connected to the gate terminal of the NMOS transistor 114.

A drain terminal of the NMOS transistor 114 is supplied with the power supply potential VDD, and a source terminal of the NMOS transistor 114 is connected to one end of the switch 115.

The other end of the switch 115 is connected to one end of the constant current source 116, the other end of the constant current source 116 is supplied with the ground potential VSS. Also, the bias current ON signal Ib_ON is input to a control terminal of the switch 115. The switch 115 is a switch having a function of controlling a load current for driving the NMOS transistor 114, and turns on when the bias current ON signal Ib_ON is activated (high level, in the present embodiment), and as a result, the source terminal of the NMOS transistor 114 is electrically connected to the one end of the constant current source 116. The signal output from the source terminal of the NMOS transistor 114 is input to the column processing circuit 120 as the pixel signal PIXO (one of PIXO1 to PIXOn in FIG. 6).

The column processing circuit 120 includes the amplification circuit 150, the holding circuit 160, and the scanning circuit 170.

The amplification circuit 150 includes an inverting amplifier 121, a capacitor 122, a switch 123, and a capacitor 124.

The capacitor 124 has one end connected to the source terminal (output terminal of the pixel circuit 110) of the NMOS transistor 114 in the pixel circuit 110, and the other end is connected to an input terminal of the inverting amplifier 121.

The inverting amplifier 121 is a grounded source amplifier constituted by a plurality of MOS transistors, for example. The capacitor 122 is a feedback capacitor of the inverting amplifier 121. The switch 123 is a feedback switch of the inverting amplifier 121. One end of the capacitor 122 and one end of the switch 123 are connected to the input terminal of the inverting amplifier 121, and the other end of the capacitor 122 and the other end of the switch 123 are connected to an output terminal of the inverting amplifier 121.

The column reset signal RST_COL is input to a control terminal of the switch 123, and the switch 123 is turned on when the column reset signal RST_COL is activated (high level, in the present embodiment).

That is, a CDS (Correlated Double Sampling) circuit is configured by the inverting amplifier 121, the capacitor 122, the switch 123, and the capacitor 124, in the amplification circuit 150. The amplification circuit 150 has a function of cancelling noise in an output voltage Vpix (refer to FIG. 8) from the pixel circuit 110 using the capacitor 124 and performing amplification thereon. The voltage at the output terminal of the inverting amplifier 121 is an output signal CDSO of the amplification circuit 150.

The holding circuit 160 includes a switch 125 and a capacitor 126.

One end of the switch 125 is connected to the output terminal (output terminal of the amplification circuit 150) of the inverting amplifier 121 included in the amplification circuit 150. The other end of the switch 125 is connected to one end of the capacitor 126. The other end of the capacitor 126 is supplied with the ground potential VSS. The readout signal READ is input to a control terminal of the switch 125, and the switch 125 is turned on when the readout signal READ is activated (high level, in the present embodiment), and as a result, the output terminal of the inverting amplifier 121 is electrically connected to the one end of the capacitor 126. Accordingly, charges corresponding to the potential difference between the output signal CDSO of the amplification circuit 150 and the ground potential VSS are accumulated (held) in the capacitor 126.

The scanning circuit 170 includes a switch 127 and a shift register (SFR) 171.

One end of the switch 127 is connected to the one end of the capacitor 126 included in the holding circuit 160, and the other end of the switch 127 is connected to the operational amplifier 131 (input terminal of the amplification circuit 130) included in the amplification circuit 130 (refer to FIG. 6). Also, a selection signal SEL is input to a control terminal of the switch 127. The switch 127 is a column selection switch, is turned on when the selection signal SEL is activated (high level, in the present embodiment), and as a result, the one end of the capacitor 126 is electrically connected to the input terminal (input terminal of the amplification circuit 130) of the operational amplifier 131. A signal (signal having a voltage corresponding to the charges accumulated in the capacitor 126) at the one end of the capacitor 126 is input to the amplification circuit 130 as an image signal VDO (one of VDO1 to VDOm in FIG. 6).

The shift register 171 outputs a selection signal SEL for controlling the switch 127 based on the input scan signal SCA. Then, the shift register 171 transfers the scan signal SCA to the adjacent scanning circuit 170 included in the column processing circuit 120-$i$+1 ($i$=1 to m−1).

That is, the scanning circuits 170 sequentially output, based on the respective scan signals SCA, the signals (signals each having a voltage corresponding to the charges accumulated in the capacitor 126) held in the respective holding circuits 160 in the column processing circuits 120-1 to 120-$m$ to the amplification circuit 130.

Figure 8:
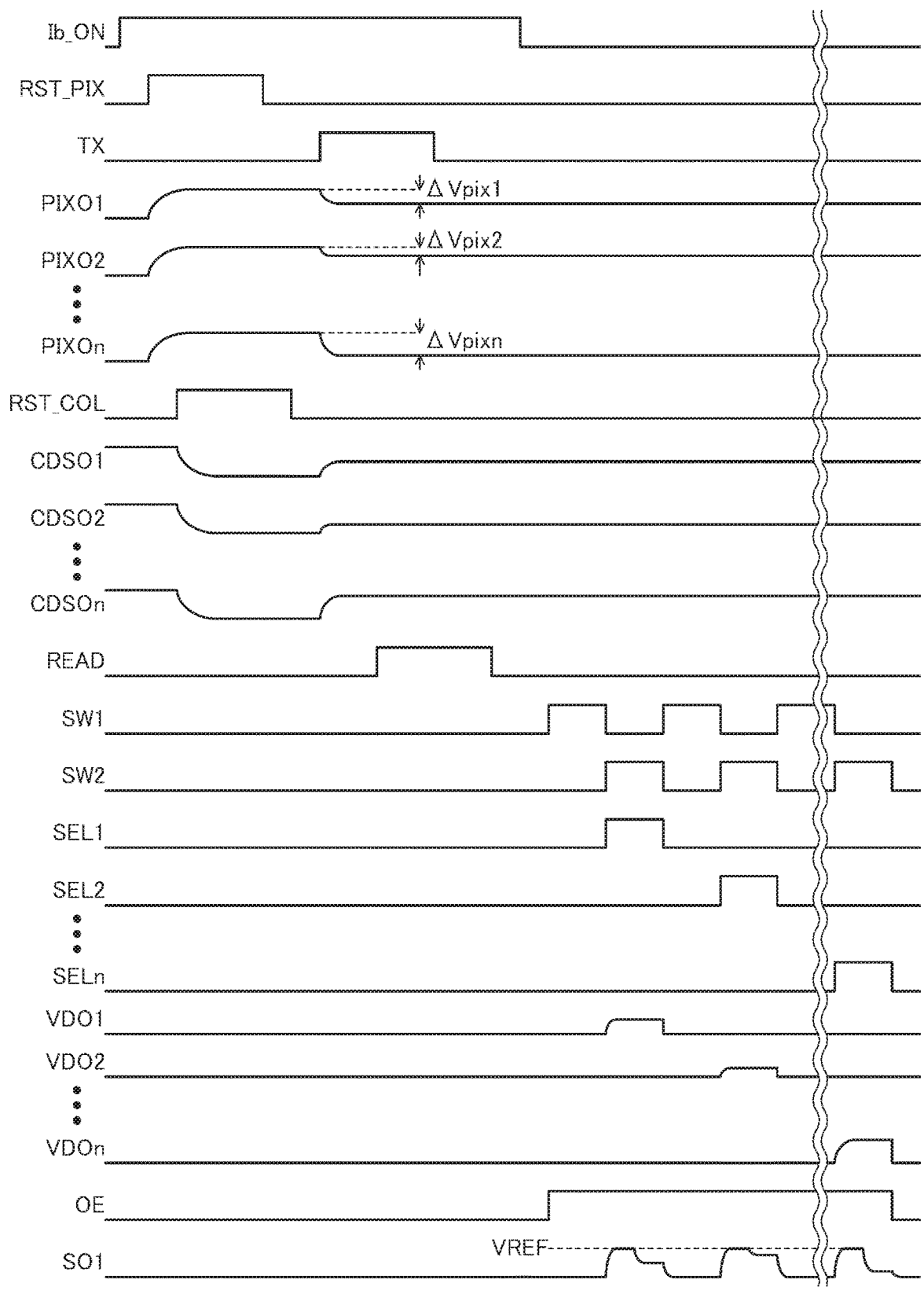
FIG. 8 is a timing chart illustrating operation timings of a signal processing circuit.

FIG. 8 is a timing chart illustrating operation timings of the signal processing circuit 103-1 shown in FIG. 6. Note that charges (negative charges) corresponding to the amount of received light are assumed to be accumulated in the photodetector 111 included in each of them pixel circuits 110 (110-1 to 110-$m$).

As shown in FIG. 8, first, the bias current ON signal Ib_ON is activated (high level, in the present embodiment), and the switch 115 is turned on in each of them pixel circuits 110. When the pixel reset signal RST_PIX is activated (high level, in the present embodiment) in this state, the NMOS transistor 113 is turned on, and the power supply potential VDD is supplied to the gate terminal of the NMOS transistor 114, in each of them pixel circuits 110. Accordingly, the gate potential of the NMOS transistor 114 is reset, and the voltages of the pixel signals PIXO1 to PIXOm that are respectively output from them pixel circuits 110 take values when the pixels are reset. At this time, because the column reset signal RST_COL is activated (high level), the switch 123 is turned on, and the charges accumulated in the capacitor 122 are discharged (the capacitor 122 is reset), in each of the m column processing circuits 120, and the voltages of the output signals CDSO1 to CDSOm of the m amplification circuits 150 decrease to a predetermined voltage.

Next, after the pixel reset signal RST_PIX and the column reset signal RST_COL are deactivated (low level), the transfer signal TX is activated (high level), and therefore, in each of the m pixel circuits 110, and the voltage corresponding to the charges accumulated in the photodetector 111 is applied to the gate terminal of the NMOS transistor 114. The larger the amount of light received by each photodetector 111, the larger the amount of charges (negative charges) accumulated in the photodetector 111, and therefore the voltage of the corresponding gate terminal of the NMOS transistor 114 decreases. Accordingly, the voltages of the pixel signals PIXO1 to PIXOm respectively decrease by ΔVpix1 to ΔVpixm. At this time, since the switch 123 is turned off, the m amplification circuits 150 operate, and the output signals CDSO1 to CDSOm increase in proportion to ΔVpix1 to ΔVpixm, respectively.

Next, after the voltages of the output signals CDSO1 to CDSOm of the m amplification circuits 150 are stabilized, when the readout signal READ is activated (high level, in the present embodiment), the switches 125 are turned on, and charges accumulated in the m capacitors 126 change according to ΔVpix1 to ΔVpixm, respectively.

Next, after the bias current ON signal Ib_ON, the transfer signal TX, and the readout signal READ are deactivated (low level, in present embodiment), an output enable signal OE (OE1 or OE2 in FIG. 8) is activated (high level, in the present embodiment) for a fixed period of time. Also, while the output enable signal OE is activated (high level, in the present embodiment), a state in which the switch control signal SW1 is activated (high level, in the present embodiment) and the switch control signal SW2 is deactivated (low level, in present embodiment) and a state in which the switch control signal SW1 is deactivated (low level) and the switch control signal SW2 is activated (high level, in the present embodiment) are alternatingly repeated. Also, every time the switch control signal SW1 is deactivated (low level, in present embodiment) and the switch control signal SW2 is activated (high level, in the present embodiment), m selection signals SEL (SEL1 to SELm), which are respectively controlled by the scanning circuits 170 provided in the m column processing circuits 120 (120-1 to 120-$m$), are sequentially activated (high level, in the present embodiment).

Then, every time the m selection signals SEL (SEL1 to SELm) are sequentially activated (high level, in the present embodiment), the image signals VDO1 to VDOm respectively having voltages corresponding to the charges accumulated in the capacitors 126 are sequentially output from the m column processing circuits 120 (120-1 to 120-$m$). The image signals VDO1 to VDOm are sequentially amplified by the amplification circuit 130, and as a result, the image signal SO1 is generated.

The timing chart illustrating the operation timings of the signal processing circuit 103-2 shown in FIG. 6 is similar to those shown in FIG. 8, and therefore the illustration and description thereof are omitted.

The image signal SO1 (or SO2) generated in the signal processing circuit 103-1 (or 103-2) is output from the image reading chip 415 as the image signal OS, which is the output of the operational amplifier 104.

In the descriptions in FIGS. 6 to 8, the red LED 412R, the green LED 412G, and the blue LED 412B are collectively referred to as the light source 412. In the present embodiment, the image reading chip 415 performs an operation shown in the timing chart in FIG. 8, when each of the red LED 412R, the green LED 412G, and the blue LED 412B is lit.

For example, the red LED 412R is lit in a period of the exposure time ΔtR according to the drive signal VrvR. Then, the photodetector 111 included in the image reading chip 415 receives light emitted by the red LED 412R and reflected by the medium, and generates charges (negative charges) according to the amount of received light. The image reading chip 415 generates the image signal OS based on the charges generated by the photodetector 111, and outputs the image signal OS.

Also, the green LED 412G is lit in a period of exposure time ΔtG according to the drive signal VrvG, for example. Then, the photodetector 111 included in the image reading chip 415 receives light emitted by the green LED 412G and reflected by the medium, and generates charges (negative charges) according to the amount of received light. The image reading chip 415 generates the image signal OS based on the charges generated by the photodetector 111, and outputs the image signal OS.

Also, the blue LED 412B is lit in a period of exposure time ΔtB according to the drive signal VrvB, for example. Then, the photodetector 111 included in the image reading chip 415 receives light emitted by the blue LED 412B and reflected by the medium, and generates charges (negative charges) according to the amount of received light. The image reading chip 415 generates the image signal OS based on the charges generated by the photodetector 111, and outputs the image signal OS.

As described above, the red LED 412R, the green LED 412G, and the blue LED 412B operate exclusively. The image reading chip 415 outputs the image signal OS with respect to each of the red LED 412R, the green LED 412G, and the blue LED 412B to the reading control circuit 200. That is, the image signal OS with respect to "red" is generated according to the charges based on the amount of received light detected by the photodetector 111 when the red LED 412R emits light to the medium. Similarly, the image signal OS with respect to "green" is generated according to the charges based on the amount of received light detected by the photodetector 111 when the green LED 412G emits light to the medium. Similarly, the image signal OS with respect to "blue" is generated according to the charges based on the amount of received light detected by the photodetector 111 when the blue LED 412B emits light to the medium.

The reading control circuit 200 reproduces the color of the medium to be read by executing image processing based on the image signal OS with respect to each of "red", "blue", and "green" that has been output from the image reading chip 415.

Figure 9:
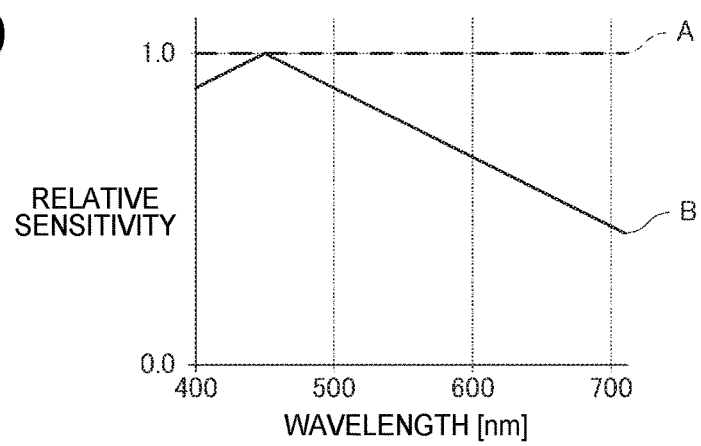
FIG. 9 is a diagram for describing spectral sensitivity of a photodetector in the present embodiment.

4. Configuration of Photodetector in the Present Embodiment 4.1 Spectral Sensitivity Characteristics of Photodetector FIG. 9 is a diagram schematically illustrating the relative sensitivity (example of "spectral sensitivity") of the photodetector 111 of the present embodiment in the visible wavelength range from 400 nm to 700 nm. In FIG. 9, the horizontal axis shows the wavelength, and the vertical axis shows the relative sensitivity of the photodetector 111.

Also, in the following description, the wavelength at which the red LED 412R emits light at the maximum light emission intensity is defined as a red wavelength WR (example of "second wavelength"), the wavelength at which the green LED 412G emits light at the maximum light emission intensity is defined as a green wavelength WG, and the wavelength at which the blue LED 412B emits light at the maximum light emission intensity is defined as a blue wavelength WB (example of "first wavelength").

In general, it is preferable that the photodetector included in the image reading device has uniform relative sensitivity in a visible range (400 nm to 700 nm) as shown by the broken line A in FIG. 9.

Specifically, if the light emission intensities of the red, green, and blue light sources are the same, it is preferable that, when each of the red, green, and blue LEDs emits light to a medium, the photodetector generates the same amount of charges. Accordingly, the photodetector can detect light with high sensitivity in the visible range irrespective of the type of light source emitting light. Therefore, the photodetector can detect the reflected light with high resolution.

However, in the case of the photodetector having a uniform relative sensitivity in the visible range as shown by the broken line A in FIG. 9, if the medium includes a fluorescent color region that is colored by a highlighter, for example, it is possible that the color reproducibility will be degraded.

When light is emitted to a medium including a fluorescent color, reflected light and fluorescent light are generated from the medium. Therefore, the photodetector detects the reflected light and the fluorescent light. For example, when the red LED emits light to the medium, the photodetector detects the reflected light and the fluorescent light based on the light emitted from the red LED, and generates an electric signal. Therefore, the image signal corresponding to "red" includes a signal based on the reflected light and a signal based on the fluorescent light. Also, when the green LED emits light to the medium, the photodetector detects the reflected light and the fluorescent light based on the light emitted from the green LED, and generates an electric signal. Therefore, the image signal corresponding to "green" includes a signal based on the reflected light and a signal based on the fluorescent light. Also, when the blue LED emits light to the medium, the photodetector detects the reflected light and the fluorescent light based on the light emitted from the blue LED, and generates an electric signal. Therefore, the image signal corresponding to "blue" includes a signal based on the reflected light and a signal based on the fluorescent light.

Therefore, in the case of the photodetector having a uniform relative sensitivity in the visible range as shown by the broken line A in FIG. 9, the reflected light that should be detected and the fluorescent light that should not be detected are similarly detected. As a result, the influence of the fluorescent light, relative to the reflected light, on the amount of light received by the photodetector increases, and the reproducibility of an image on the medium degrades.

It is preferable that, in order to improve the reproducibility of an image including a fluorescent color region on a medium, the photodetector has a low relative sensitivity with respect to the fluorescent light relative to the relative sensitivity in a wavelength of the reflected light.

The fluorescent light is generated on a long wavelength side relative to the wavelength of the excitation light (light source). Therefore, the photodetector 111 in the present embodiment has a relative sensitivity as shown by the solid line B in FIG. 9. Specifically, the relative sensitivity of the photodetector 111 is configured so as to take a maximum value in the light wavelength region from 400 nm to 500 nm, and gradually decrease as the wavelength increases, in the visible range.

As a result of configuring the relative sensitivity of the photodetector 111 so as to decrease in a region on the long wavelength side, the influence of the fluorescent light that should not be detected on the reflected light that should be detected can be reduced, in the photodetector 111. Therefore, the reproducibility of an image, on a medium, including the fluorescent color can be improved.

Here, as a result of configuring the relative sensitivity of the photodetector 111 so as to take a maximum value in a region from 400 nm to 500 nm inclusive that includes the blue wavelength region, which is the shortest wavelength region among "red, green, and blue" that are three primary colors, and is equal to or shorter than the green wavelength region, an excessive reduction in the sensitivity of the photodetector 111 can be avoided in a long wavelength region, and the resolution of the photodetector 111 in the visible range can be improved.

Furthermore, it is preferable that the relative sensitivity of the photodetector 111 takes the maximum value at a wavelength shorter than the blue wavelength WB. Accordingly, in the photodetector 111, the influence of fluorescent light due to light emitted from the blue LED 412B can be reduced. Therefore, the reproducibility of an image on a medium including a fluorescent color can be improved.

As described above, as a result of configuring the relative sensitivity of the photodetector 111 in the present embodiment so as to take the maximum value in the wavelength region from 400 nm to 500 nm, the reproducibility of an image on a medium including a fluorescent color can be improved without requiring a complicated operation or complicated control. It is further preferable that the relative sensitivity of the photodetector 111 takes the maximum value at a wavelength shorter than and close to the blue wavelength WB.

Here, the exposure time ΔtB of the blue LED 412B may be shorter than the exposure time ΔtG of the green LED 412G, and the exposure time ΔtG of the green LED 412G may be shorter than the exposure time ΔtR of the red LED 412R.

In the present embodiment, the relative sensitivity of the photodetector 111 decreases on the long wavelength side. Therefore, even if the amount of reflected light that is generated due to the light emitted from each of the red LED 412R, the green LED 412G, and the blue LED 412B is the same, the amount of received light detected by the photodetector 111 decreases on the long wavelength side. Therefore, as a result of setting the exposure time of the light source 412 such that exposure time ΔtB exposure time ΔtG exposure time ΔtR, the decrease in the relative sensitivity of the photodetector 111 on the long wavelength side can be corrected. Accordingly, the detection sensitivity of the photodetector 111 can be improved.

Also, the light emission intensity of the blue LED 412B may be smaller than the light emission intensity of the green LED 412G, and the light emission intensity of the green LED 412G may be smaller than the light emission intensity of the red LED 412R.

In the present embodiment, the relative sensitivity of the photodetector 111 decreases on the long wavelength side. Therefore, as a result of setting the intensity of light emitted from each of the red LED 412R, the green LED 412G, and the blue LED 412B such that blue LED 412B green LED 412G red LED 412R, the detection sensitivity of the photodetector 111 can be improved.

In the present embodiment, as a result of adjusting the exposure time and the light emission intensity of each of the red LED 412R, the green LED 412G, and the blue LED 412B, the amount of charges generated by the photodetector 111 due to light emitted from each of the red LED 412R, the green LED 412G, and the blue LED 412B can be made substantially the same. That is, the reduction in relative sensitivity of the photodetector 111 on the long wavelength side can be corrected by the light emission intensity. Accordingly, the photodetector 111 can detect with high resolution, and the ability to read a medium can be improved.

Note that the adjustment of the exposure time and the light emission intensity of each of the red LED 412R, the green LED 412G, and the blue LED 412B is performed in order to correct the reduction in relative sensitivity of the photodetector 111 on the long wavelength side. Therefore, the correction may be performed by adjusting one of the exposure time and the light emission intensity, or by adjusting both the exposure time and the light emission intensity. Furthermore, the reduction in relative sensitivity may be corrected by differentiating the frequency of lighting of the red LED 412R, the green LED 412G, and the blue LED 412B that are lit exclusively to each other.

Figure 10:
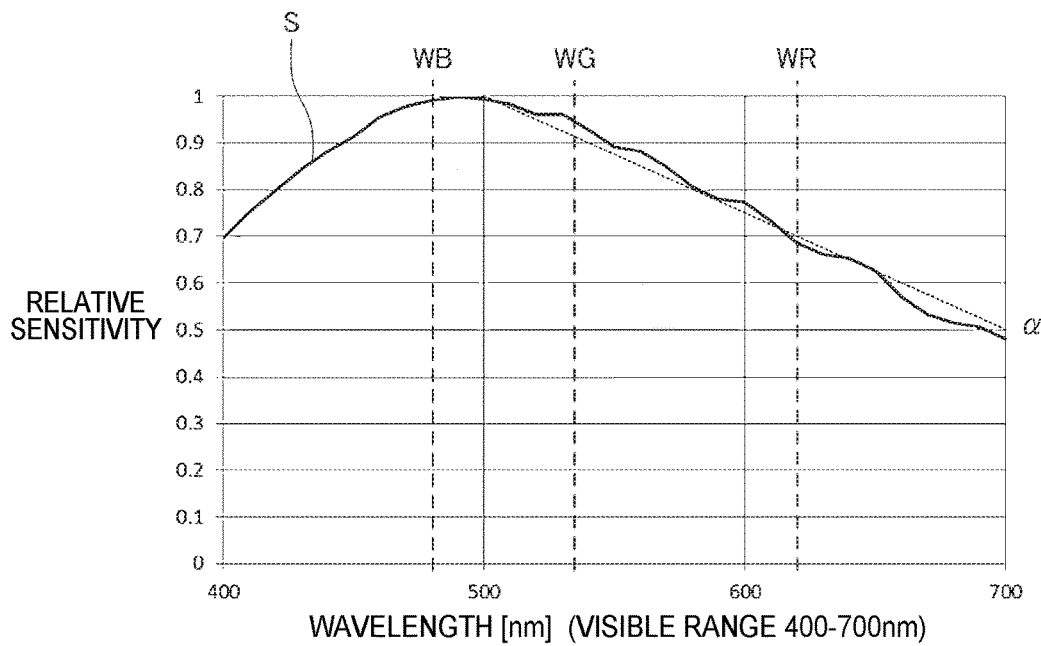
FIG. 10 is a diagram illustrating an exemplary measurement result of the spectral sensitivity of the photodetector in the present embodiment.

FIG. 10 is a diagram illustrating the spectral sensitivity characteristics, in the visible range (400 nm to 700 nm), of the photodetector 111 in the present embodiment.

In the graph in FIG. 10, the horizontal axis shows the wavelength, and the vertical axis shows the relative sensitivity.

FIG. 10 shows a diagram of the spectral sensitivity characteristics of a photodetector 111 that has been manufactured such that the maximum relative sensitivity is in a range from 400 nm to 500 nm inclusive, and with which the reproducibility of an image on a medium including a fluorescent color region is improved. Note that, in FIG. 10, in addition to the measured relative sensitivity S, the wavelengths of LEDs in the light source 412 of the scanner unit 3 used for measurement are also shown as the red wavelength WR (620 nm), the green wavelength WG (540 nm), and the blue wavelength WB (480 nm).

As shown in FIG. 10, the relative sensitivity S of the photodetector 111 takes a maximum value at a wavelength of 400 nm or more and 500 nm or less, specifically in the vicinity of 490 nm. Also, the relative sensitivity S of the photodetector 111 gradually decreases as the wavelength increases in the region beyond 500 nm, along the broken line a shown in FIG. 10. That is, in the present embodiment, the relative sensitivity S of the photodetector 111 substantially linearly decreases toward the long wavelength side. Therefore, in the photodetector 111, the influence of fluorescent light that should not be detected on the reflected light, due to light from the light source 412, decreases, and the reproducibility of an image including a fluorescent color on a medium can be improved.

Here, the influence of fluorescent light in the photodetector 111 is determined by the ratio between the relative sensitivity of the photodetector 111 at the wavelength of light from the light source 412 and the relative sensitivity of the photodetector 111 at the wavelength of the fluorescent light. That is, when the relative sensitivity of the photodetector 111 at the wavelength of the fluorescent light is large relative to the relative sensitivity of the photodetector 111 at the wavelength of light from the light source 412, the influence of the fluorescent light on the amount of light received by the photodetector 111 increases. Accordingly, the reproducibility of an image including a fluorescent color on a medium decreases in the scanner unit 3. On the other hand, when the relative sensitivity of the photodetector 111 at the wavelength of the fluorescent light is small relative to the relative sensitivity of the photodetector 111 at the wavelength of light from the light source 412, the influence of the fluorescent light on the amount of light received by the photodetector 111 decreases. Therefore, the reproducibility of an image including a fluorescent color on a medium can be improved in the scanner unit 3.

In the following description, the relative sensitivity of the photodetector 111 at a given wavelength relative to the relative sensitivity of the photodetector 111 at the blue wavelength WB, which is on the shortest wavelength side in the present embodiment, is defined as the sensitivity ratio. Note that, in FIG. 10, because the relative sensitivity at the blue wavelength WB is about 0.99 times the maximum relative sensitivity, in the following description, the sensitivity ratio is assumed to have the same value as the relative sensitivity.

In the present embodiment, the broken line a takes a sensitivity ratio of 0.7 at the red wavelength WR (620 nm). Therefore, if the sensitivity ratio of the photodetector 111 at the wavelength of the fluorescent light is 0.7 or less, the influence of the fluorescent light that should not be detected on the reflected light that should be detected can be reduced in the photodetector 111, the fluorescent light and the reflected light being a result of light emitted from the light source 412, and the reproducibility of an image including the fluorescent color on a medium can be considered to be improved. Therefore, it is preferable that the sensitivity ratio of the photoelectric conversion at the light wavelength of 700 nm is 0.7 or less in the photodetector 111.

Accordingly, in the photodetector 111, the influence of fluorescent light that should not be detected on the reflected light from a medium that should be detected can be reduced. Therefore, the reproducibility of an image including a fluorescent color on a medium can be improved.

Also, it is further preferable that the sensitivity ratio of the photoelectric conversion at the light wavelength of 700 nm is 0.5 or less in the photodetector 111. Accordingly, in the photodetector 111, the influence of fluorescent light that should not be detected on the reflected light from a medium that should be detected can be further reduced. Therefore, the reproducibility of an image including a fluorescent color on a medium can be further improved.

As a result of setting the sensitivity ratio of the photodetector 111 at 700 nm to 0.7 or less, the reproducibility of an image including a fluorescent color on a medium can be improved. Also, as a result of setting the sensitivity ratio of the photodetector 111 at 700 nm to 0.5 or less, the reproducibility of an image including a fluorescent color on a medium can be further improved.

Furthermore, it is preferable that the relative sensitivity of the photodetector 111 gradually decreases as the wavelength increases. As a result of employing a configuration in which the relative sensitivity of the photodetector 111 gradually decreases as the wavelength increases, the influence of fluorescent light on the reflected light that should be detected can be reduced in the photodetector 111. Therefore, the reproducibility of an image including a fluorescent color on a medium can be improved. Specifically, the sensitivity ratio of the photoelectric conversion at the light wavelength of 600 nm is preferably 0.85 times the sensitivity ratio of the photoelectric conversion at the blue wavelength WB, or less.

4.2 Structure of Photodetector

Here, an exemplary structure of the photodetector 111, which is shown in the present embodiment, whose detection sensitivity takes a maximum value at a wavelength in a range from 400 nm to 500 nm will be described.

Figure 11:
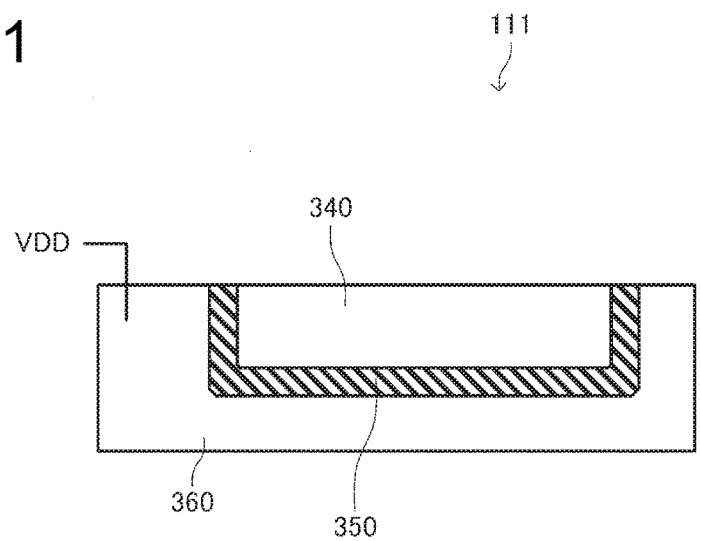
FIG. 11 is a diagram illustrating a structure of the photodetector in the present embodiment.

FIG. 11 is a schematic diagram illustrating a cross-sectional structure of the photodetector 111. In the present embodiment, the photodetector 111 is constituted by an N-type semiconductor substrate 360, a P-type semiconductor 350, and an N-type semiconductor 340, as shown in FIG. 11. Specifically, in the photodetector 111, a photodiode is formed by a PN junction between the P-type semiconductor 350 and the N-type semiconductor 340 that are formed on the N-type semiconductor substrate 360 (example of "n-type semiconductor substrate"). The photodetector 111 performs photoelectric conversion on light incident on the N-type semiconductor 340 so as to generate charges, and outputs an electric signal from an unshown electrode.

Charges are generated by photoelectric conversion in all the regions of the N-type semiconductor substrate 360, the P-type semiconductor 350, and the N-type semiconductor 340 in the photodetector 111. However, most of the charges that are generated in neutral regions, of the charged that are generated by photoelectric conversion, are recombined with the nearby charges, and are not reflected on the signal from the photodetector 111. In other words, most of the charges that are output as a signal from the photodetector 111 are charges that are generated in a depletion layer formed between the P-type semiconductor 350 and the N-type semiconductor 340.

Also, the light incident on the photodetector 111 is gradually absorbed and attenuated as the light enters deep into the photodetector 111. The absorption of light in the photodetector 111 depends on the wavelength of light that is incident thereon. Specifically, light having a long wavelength enters deep into the photodetector 111, and light having a short wavelength is absorbed in a shallow region in the photodetector 111. Then, the absorbed light is output as heat or charges.

Accordingly, the photodetector 111 having the relative sensitivity shown in the present embodiment can be realized by optimizing the depth at which the depletion layer of the photodetector 111 is provided and the thickness of the depletion layer.

Specifically, when the depletion layer is provided on a side (shallow side) on which light is incident on the photodetector 111, the relative sensitivity at a short wavelength increases in the photodetector 111, and when the depletion layer is provided on a deeper side, the relative sensitivity at a long wavelength increases in the photodetector 111. Also, when the width of the depletion layer increases, the relative sensitivity increases in a wider wavelength region, and when the width of the depletion layer decreases, the relative sensitivity increases in a narrower wavelength region. That is, the slope of the relative sensitivity with respect to the wavelength can be adjusted.

Also, the photodetector 111 in the present embodiment is preferably formed on the N-type semiconductor substrate that is applied with the power supply potential VDD.

As described above, the light incident on the photodetector 111 is subjected to photoelectric conversion in the N-type semiconductor substrate 360 as well. Also, the longer the wavelength of the incident light, the deeper in the photodetector 111 the region at which the light is subjected to photoelectric conversion. That is, in the N-type semiconductor substrate 360, light having a longer wavelength is subjected to photoelectric conversion. As shown in the present embodiment, the power supply potential VDD is applied to the N-type semiconductor substrate 360. Therefore, the charges generated by photoelectric conversion in the N-type semiconductor substrate 360 are attracted to the power supply potential VDD. That is, the charges generated by photoelectric conversion in the N-type semiconductor substrate 360 are unlikely to be output as an electric signal from an electrode provided in the photodetector 111. As a result, in the photodetector 111, the relative sensitivity on the long wavelength side can be decreased relative to the relative sensitivity on the short wavelength side. In other words, it is possible that the relative sensitivity of the photodetector 111 takes a maximum value on the short wavelength side.

Accordingly, in the present embodiment, it is preferable that the photodetector 111 is formed on the N-type semiconductor substrate 360 in order for the relative sensitivity characteristics to take a maximum value on the short wavelength side. Note that the N-type semiconductor substrate 360 may be replaced by an N-well formed on a silicon substrate, or may be a silicon substrate that is doped with impurities.

5. Action/Effect

As described above, in the scanner unit (image reading device) 3 according to the present embodiment, the relative sensitivity of the photodetector 111 that performs photoelectric conversion on light received from a medium takes a maximum value at light having a wavelength in a region from 400 nm to 500 nm inclusive, in the image reading chip 415. That is, in the photodetector 111, the relative sensitivity decreases on the long wavelength side exceeding 500 nm of wavelength. Accordingly, in the photodetector 111, the influence of fluorescent light that should not be detected on the reflected light from a medium that should be detected can be reduced. As a result, the reproducibility of an image including a fluorescent color on a medium can be improved without requiring a complicated operation or complicated control.

Also, in the scanner unit (image reading device) 3 according to the present embodiment, the relative sensitivity of the photodetector 111 takes a maximum value at light having a wavelength in a range from 400 nm to 500 nm inclusive, in the image reading chip 415. That is, the relative sensitivity of the photodetector 111 takes a maximum value at a wavelength in a range including the blue wavelength region. As a result of performing setting such that the relative sensitivity of the photodetector 111 takes a maximum value at a wavelength in a wavelength region of blue, which has the shortest wavelength among the three primary colors (red, green, and blue), the reproducibility of an image including various fluorescent colors on a medium can be improved.

Also, in the scanner unit (image reading device) 3 according to the present embodiment, the relative sensitivity of the photodetector 111 takes a maximum value at a wavelength on the short wavelength side relative to the blue wavelength WB, in the image reading chip 415. Accordingly, in the photodetector 111, the influence of fluorescent light on the light reflected from a medium when light is emitted from the blue LED 412B that outputs light on the short wavelength side can be reduced. That is, in the photodetector 111, the influence of fluorescent light that should not be detected on the reflected light from a medium that should be detected can be reduced when any of the blue LED 412B, the green LED 412G, and the red LED 412R emits light. As a result, the reproducibility of an image including a fluorescent color on a medium can be further improved.

Also, in the scanner unit (image reading device) 3 according to the present embodiment, the photodetector 111 is formed in the N-type semiconductor substrate 360, in the image reading chip 415. Accordingly, the charges generated by photoelectric conversion in a deep portion of the photodetector 111 are attracted to the positive potential (power supply potential VDD), and are not output as a signal from the photodetector 111. That is, in the photodetector 111, the relative sensitivity on the long wavelength side can be decreased. Accordingly, in the photodetector 111, the influence of fluorescent light that should not be detected on the reflected light from a medium that should be detected can be further reduced. As a result, the reproducibility of an image including a fluorescent color on a medium can be further improved.

Also, in the scanner unit (image reading device) 3 according to the present embodiment, the lighting time of the blue LED 412B that emits light on the short wavelength side may be shorter than those of the green LED 412G and the red LED 412R that emit light on the long wavelength side. Also, the light emission intensity of the blue LED 412B that emits light on the short wavelength side may be weaker than those of the green LED 412G and the red LED 412R that emit light on the long wavelength side. Accordingly, the light receiving amount detected by the photodetector 111 can be equivalent in a region on the short wavelength side in which the relative sensitivity of the photodetector 111 is high and in a region on the long wavelength side in which the relative sensitivity of the photodetector 111 is low, and as a result, the resolution of a signal detected by the photodetector 111 can be increased. Accordingly, the ability to read a medium can be further improved.

Also, in the scanner unit (image reading device) 3 according to the present embodiment, as a result of setting the relative sensitivity of the photodetector 111 at a wavelength of 700 nm to be 0.7 times the relative sensitivity of the photodetector 111 at the blue wavelength WB, or less, for example, the influence of fluorescent light that should not be detected on the reflected light from a medium that should be detected can be reduced, in the image reading chip 415, and as a result, the reproducibility of an image including a fluorescent color on a medium can be improved.

Furthermore, as a result of setting the relative sensitivity of the photodetector 111 at a wavelength of 700 nm to be 0.5 times the relative sensitivity of the photodetector 111 at the blue wavelength WB, or less, for example, the influence of fluorescent light that should not be detected on the reflected light from a medium that should be detected can be further reduced. Accordingly, the reproducibility of an image including a fluorescent color on a medium can be further improved.

Also, as a result of setting the relative sensitivity of the photodetector 111 at a wavelength of 600 nm to be 0.85 times the relative sensitivity of the photodetector 111 at the blue wavelength WB, or less, for example, the detection sensitivity of the photodetector 111 can be gradually decreased from the wavelength at which the detection sensitivity of the photodetector 111 takes the maximum value to a wavelength of 700 nm. Accordingly, the influence of fluorescent light that should not be detected on the reflected light from a medium that should be detected can be further reduced in a wide wavelength region. Therefore, the reproducibility of an image including a fluorescent color on a medium can be further improved.

6. Modifications

The scanner unit 3 in the present embodiment is configured such that a medium placed on the platen T is read, as shown in FIGS. 1 and 2, but may be a conveyance type scanner unit including an ADF (auto document feeder) and the like. Furthermore, the scanner unit 3 may be configured as a double-side reading type scanner that includes the image sensor modules 41 on both the surface and back surface of the medium, and reads the surface and back surface of the medium at the same time. These modifications can also achieve similar effects to those of the above-described embodiment.

Although the embodiment and the modifications have been described above, the invention is not limited to these embodiment and the modifications, and can be carried out in various modes without departing from the gist of the invention. For example, the embodiment and the modifications can be combined as appropriate.

The invention includes substantially the same configurations (configurations with the same functions, methods, and results, or configurations with the same object and effect, for example) as the configurations described in the embodiment. The invention includes configurations in which an unessential part of the configurations described in the embodiment is replaced. The invention also includes configurations that achieve the same effect as that of the configurations described in the embodiment, or configurations that can achieve the same object as that of the configurations described in the embodiment. The invention also includes configurations obtained by adding a known technique to the configurations described in the embodiment.

This application claims priority from Japanese Patent Application No. 2017-056543 filed in the Japanese Patent Office on Mar. 22, 2017, the entire disclosure of which is hereby incorporated by reference in its entirely.

What is claimed is:

1. An image reading device for reading an image including a fluorescent color, the image reading device comprising:
   a first light source having a maximum light emission intensity at a first wavelength that is 400 nm or greater and 500 nm or less;

a second light source having a maximum light emission intensity at a second wavelength that is longer than the first wavelength; and an image reading chip configured to read the image, the image reading chip having a pixel including a photodetector that performs photoelectric conversion on light received from the image, wherein:

the spectral sensitivity of the photodetector when photoelectric conversion is performed takes a maximum value at a wavelength on a short wavelength side relative to the first wavelength, the short wavelength side being within a region from 400 nm to 500 nm inclusive.

2. The image reading device according to claim 1, wherein the photodetector is formed in an n-type semiconductor substrate.

3. The image reading device according to claim 1, wherein a lighting time of the first light source is shorter than a lighting time of the second light source.

4. The image reading device according to claim 1, wherein a light emission intensity of the first light source is weaker than a light emission intensity of the second light source.

5. The image reading device according to claim 1, wherein the spectral sensitivity of the photodetector when photoelectric conversion is performed on light having a wavelength of 700 nm is 0.7 times the spectral sensitivity when photoelectric conversion is performed on light having the first wavelength, or less.

6. The image reading device according to claim 1, wherein the spectral sensitivity of the photodetector when photoelectric conversion is performed on light having a wavelength of 700 nm is 0.5 times the spectral sensitivity when photoelectric conversion is performed on light having the first wavelength, or less.

7. The image reading device according to claim 1, wherein the spectral sensitivity of the photodetector when photoelectric conversion is performed on light having a wavelength of 600 nm is 0.85 times the spectral sensitivity when photoelectric conversion is performed on light having the first wavelength, or less.

8. The image reading device according to claim 1, wherein
the fluorescent color is a color of a region colored by a highlighter, and
the image includes the region colored by a highlighter.

9. A semiconductor device comprising:
a pixel including a photodetector that performs photoelectric conversion on light received from an image, wherein
the spectral sensitivity of the photodetector when photoelectric conversion is performed in a region from 400 nm or more to 700 nm or less takes a maximum value at a wavelength on a short wavelength side relative to the first wavelength, the short wavelength side being within a region from 400 nm to 500 nm inclusive.

10. The image reading device according to claim 1, wherein the spectral sensitivity of the photodetector when photoelectric conversion is performed on light having a wavelength between 600 nm to 700 nm is between 0.5 to 0.85 times the spectral sensitivity when photoelectric conversion is performed on light having the first wavelength, or less.

11. The semiconductor device according to claim 9, wherein the spectral sensitivity of the photodetector when photoelectric conversion is performed on light having a wavelength between 600 nm to 700 nm is between 0.5 to 0.85 times the spectral sensitivity when photoelectric conversion is performed on light having the first wavelength, or less.

* * * * *